United States Patent
Lee

(12) 
(10) Patent No.: US 6,459,131 B1
(45) Date of Patent: Oct. 1, 2002

(54) CMOS IMAGE SENSOR AND METHOD FOR FABRICATING THE SAME

(75) Inventor: Kyung-Lak Lee, Ichon-shi (KR)

(73) Assignee: Hyundai Electronics Industries Co., Ltd., Kyungki-Do (KR)

(*) Notice: Subject to any disclaimer, the term of this patent is extended or adjusted under 35 U.S.C. 154(b) by 0 days.

(21) Appl. No.: 09/947,690

(22) Filed: Sep. 6, 2001

(30) Foreign Application Priority Data

Oct. 4, 2000 (KR) .......................................... 2000-58165

(51) Int. Cl.[7] ..................... H01L 31/0232; H01L 31/00; H01L 23/58
(52) U.S. Cl. ........................ 257/432; 257/440; 257/640; 438/70
(58) Field of Search ................................. 257/432, 440, 257/640; 438/70

(56) References Cited

U.S. PATENT DOCUMENTS 5,739,548 A * 4/1998 Shigeta et al. ................ 257/59
6,008,511 A * 12/1999 Tokumitsu et al. .......... 257/232

* cited by examiner

Primary Examiner—Ngân V. Ngô
(74) Attorney, Agent, or Firm—Marshall, Gerstein & Borun

(57) ABSTRACT

A CMOS image sensor for preventing a formation of scum and overlaps of neighboring color filters is provided. The image sensor includes: a semiconductor structure; a first color filter formed on the semiconductor structure, wherein the first color filter includes a first stacked layer, the first stacked layer having a first nitride layer and a first oxide layer; a second color filter, wherein the second color filter is formed with a dyed photoresist and in contact with the first color filter; and a third color filter formed on a portion where is not overlapped with the first and the second color filter, wherein the third color filter includes a second stacked layer, the second stacked layer having a second nitride layer and a second oxide layer.

19 Claims, 6 Drawing Sheets

US 6,459,131 B1

CMOS IMAGE SENSOR AND METHOD FOR FABRICATING THE SAME

BACKGROUND

1. Field of the Invention

The present invention relates to a semiconductor device. More particularly, the present invention relates to a CMOS image sensor capable of preventing scum formation and overlapping of neighboring color filters. A method for fabricating the same is also disclosed.

2. Description of the Prior Art

As is well known, an image sensor is an apparatus for sensing a light beam reflected from an object to generate an image data. Especially, an image sensor fabricated by using a complementary metal oxide semiconductor (CMOS) technology is called a CMOS image sensor.

Generally, the CMOS image sensor includes a plurality of unit pixels. Each of the unit pixels also includes a light sensing element and a plurality of transistors. The light sensing element such as a photodiode senses incident light beam to generate photoelectric charges corresponding to an amount of the incident light beam. The transistors perform switching operations to control a transfer of the photoelectric charges.

FIG. 1 is a circuit diagram showing a unit pixel contained in a CMOS image sensor. Here, a reference symbol ML denotes a load transistor for controlling a current that flows via an output node NO of the unit pixel 10.

Referring to FIG. 1, the unit pixel 10 includes a photodiode 12 and four transistors. Four transistors also include a transfer transistor MT, a reset transistor MR, a drive transistor MD and a select transistor MS.

The photodiode 12 senses an incident light to generate photoelectric charges. The transfer transistor MT, coupled between the photodiode 12 and a sensing node NS, transfers the photoelectric charges to the sensing node NS. The reset transistor MR, coupled between a power terminal VDD and the sensing node NS, transfers a reset voltage level from a voltage source to the photodiode 12 and the drive transistor MD.

The drive transistor MD, whose drain is coupled to the power terminal VDD, amplifies a voltage level of the sensing node NS to output an amplified signal. The select transistor MS, coupled between the drive transistor MD and an output node NO, performs a switching operation to output the amplified signal as an image data via the output node NO.

FIG. 2 is a cross-sectional view showing a conventional CMOS image sensor.

As shown, a passivation layer 20 is formed on a semiconductor structure (not shown) including a photodiode and a peripheral circuit. Dyed photoresists are coated on the passivation layer 20 and then patterned to sequentially form color filters. However, due to an influence of the previously formed color filter, a scum is formed in the color filter and an overlap of neighboring color filters is occurred so that a sensitivity of the color filters is degraded.

SUMMARY OF THE DISCLOSURE

A CMOS image sensor is disclosed for preventing a formation of scum and overlapping of neighboring color filters.

An image sensor is disclosed which comprises: a semiconductor structure; a first color filter formed on the semiconductor structure, wherein the first color filter includes a first stacked layer, the first stacked layer having a first nitride layer and a first oxide layer; a second color filter, wherein the second color filter is formed with a dyed photoresist and in contact with the first color filter; and a third color filter formed on a portion where is not overlapped with the first and the second color filter, wherein the third color filter includes a second stacked layer, the second stacked layer having a second nitride layer and a second oxide layer.

A method for fabricating an image sensor is also disclosed which comprises: a) providing a semiconductor structure; b) forming a first color filter on the semiconductor structure, wherein the first color filter includes a first stacked layer having a first nitride layer and a first oxide layer; c) forming a second color filter in contact with the first color filter; and d) forming a third color filter on a portion where is not overlapped with the first and the second color filter, wherein the third color filter includes a second stacked layer having a second nitride layer and a second oxide layer.

BRIEF DESCRIPTION OF THE DRAWINGS

Other aspects of the disclosure will become apparent from the following description of the embodiments with reference to the accompanying drawings, wherein.

DETAILED DESCRIPTION OF THE PREFERRED EMBODIMENTS

Figure 1:
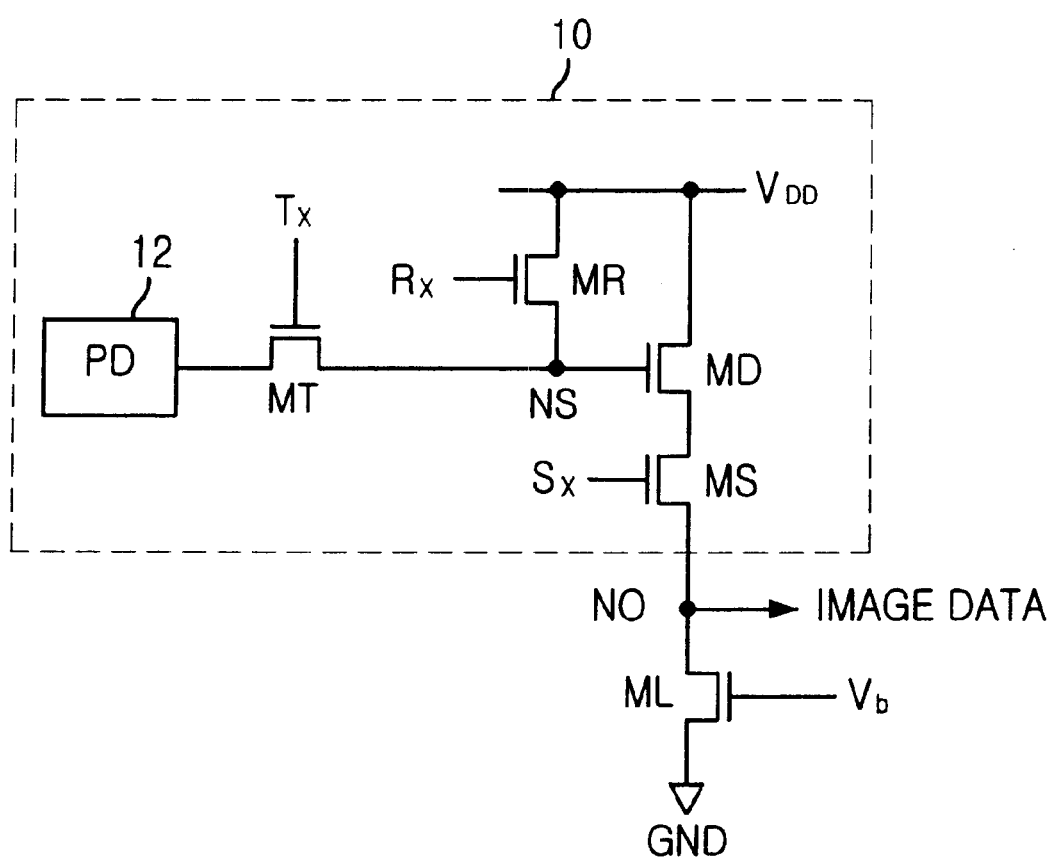
FIG. 1 is a schematic diagram showing a conventional unit pixel contained in a CMOS image sensor.
Figure 2:
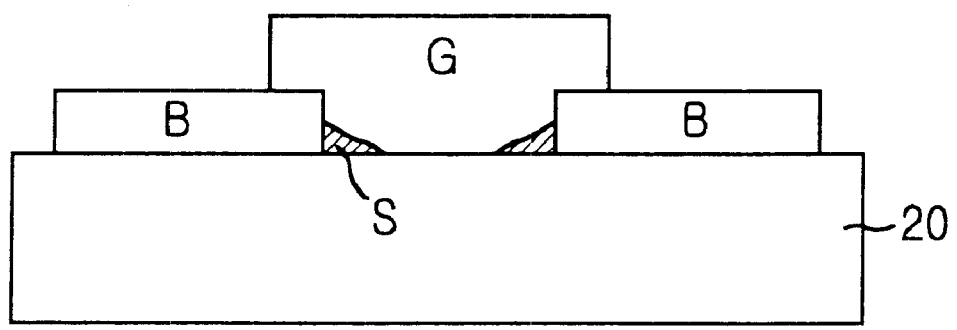
FIG. 2 is a cross-sectional view showing a conventional CMOS image sensor.
Figure 3:
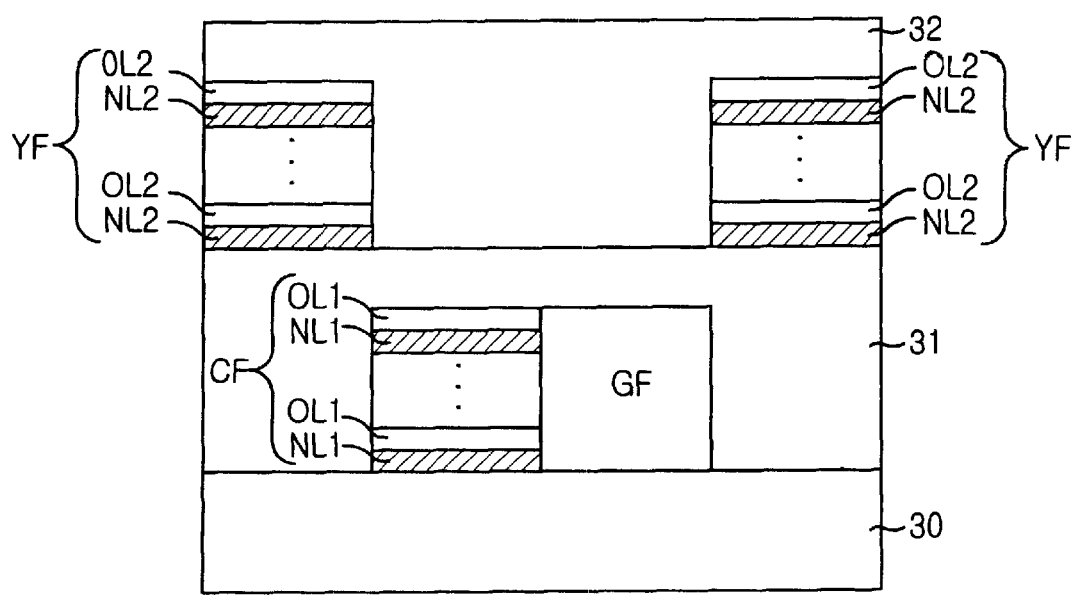
FIG. 3 is a cross-sectional view illustrating a CMOS image sensor in accordance with the disclosure.

FIG. 3 is a cross-sectional view illustrating a CMOS image sensor in accordance with the present invention.

Referring to FIG. 3, the CMOS image sensor includes a semiconductor structure having a passivation layer 30, a cyan color filter CF, a green color filter GF, a first coating layer 31, a yellow color filter YF and a second coating layer 32.

The cyan color filter CF for transmitting a cyan light is formed on the passivation layer 30. The cyan color filter CF includes at least one first stacked layer, each of which has a first nitride layer NL1 and a first oxide layer OL1.

The green color filter GF for transmitting a green light is formed with a dyed photoresist and in contact with the cyan color filter CF.

The first coating layer 31 is formed on the cyan color filter CF and the green color filter GF. The yellow color filter YF for transmitting a yellow light is formed on the first coating layer 31. At this time, the yellow color filter YF is positioned on a portion where is not overlapped with the cyan color filter YF and the green color filter GF. The yellow color filter YF includes at least one second stacked layer, each of which has a second nitride layer NL2 and a second oxide layer OL2.

Each reflective index of the first and the second nitride layers NL1 and NL2 is of 2.1, and each reflective index of the first and the second oxide layers OL1 and OL2 is of 1.46.

Additionally, the first nitride layer NL1 is formed to a thickness ranging from about 735 Å to about 813 Å, and the first oxide layer OL1 is formed to a thickness ranging from about 1046 Å to 1166 Å. The second nitride layer NL2 is formed to a thickness ranging from about 508 Å to about 562 Å, and the second oxide layer OL2 is formed to a thickness ranging from about 732 Å to about 809 Å.

FIGS. 4A to 4F are cross-sectional views illustrating sequential steps of fabricating a CMOS image sensor in accordance with the present invention.

Figure 4A:
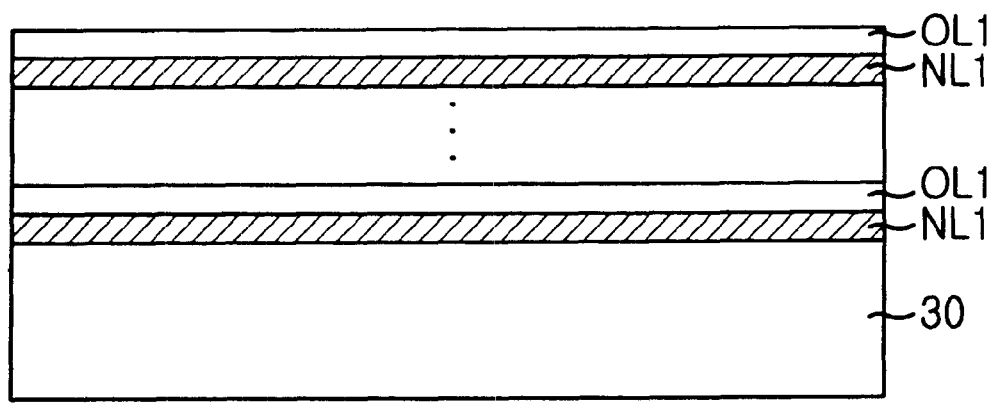
FIGS. 4A to 4F are cross-sectional views illustrating sequential steps of fabricating a CMOS image sensor in accordance with the disclosure.

Referring to FIG. 4A, a passivation layer 30 is formed on a semiconductor structure (not shown) including a photodiode and a peripheral circuit. Then, a first nitride layer NL1, whose reflective index is about 2.1, is formed on the passivation layer 30 to a thickness ranging from about 735 Å to about 813 Å by using a plasma chemical vapor deposition (CVD). Thereafter, a first oxide layer OL1, whose reflective index is about 1.46, is formed on the first nitride layer NL1 to a thickness ranging from about 1046 Å to about 1166 Å. Then, first stacked layers, each of which is composed of the first nitride layer NL1 and the first oxide layer OL1, are repeatedly formed.

Figure 4B:
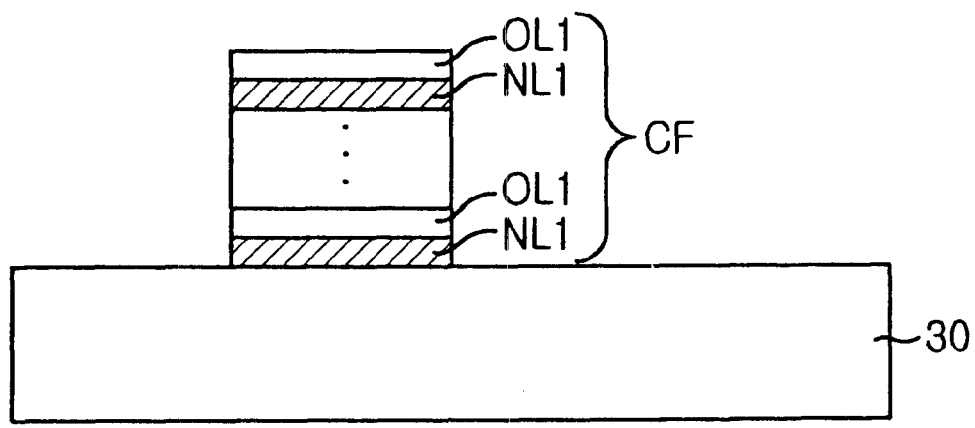

Referring to FIG. 4B, the first stacked layers are patterned to form a cyan color filter CF. At this time, the cyan optical filter CF transmits only a cyan light corresponding to a sum of a blue light and a green light.

Figure 4C:
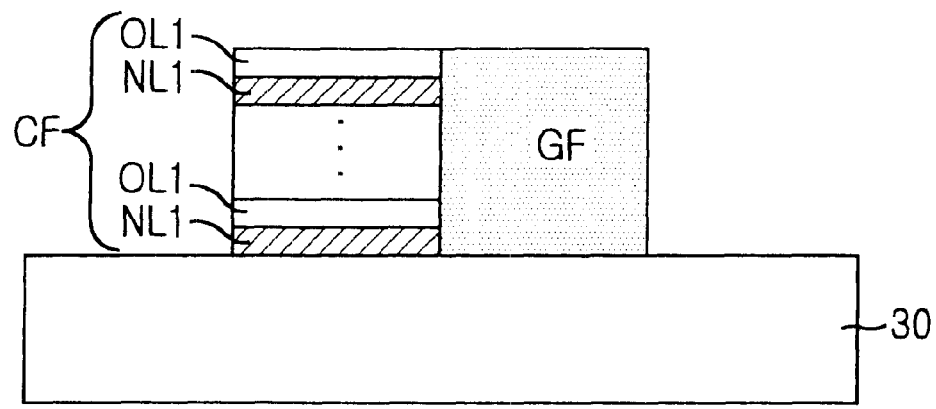

Referring to FIG. 4C, a photoresist is coated to a thickness of about 1 m and then patterned to thereby form a green color filter GF in contact with the cyan color filter CF.

Figure 4D:
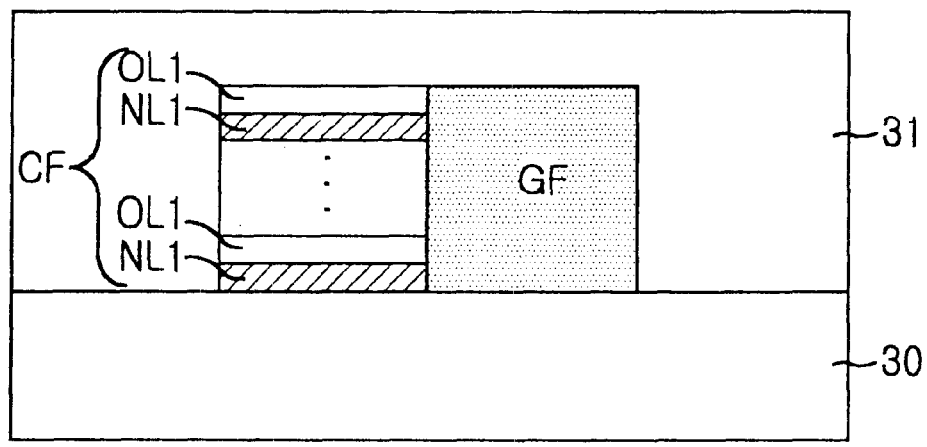

Referring to FIG. 4D, a dyed photoresist is coated on an entire structure to a thickness of about 1.6 m to form a first over coating layer (OCL) 31. Then, a baking operation is carried out in order to preventing the photoresist from being burned in forming a next color filter on the first OCL 31.

Figure 4E:
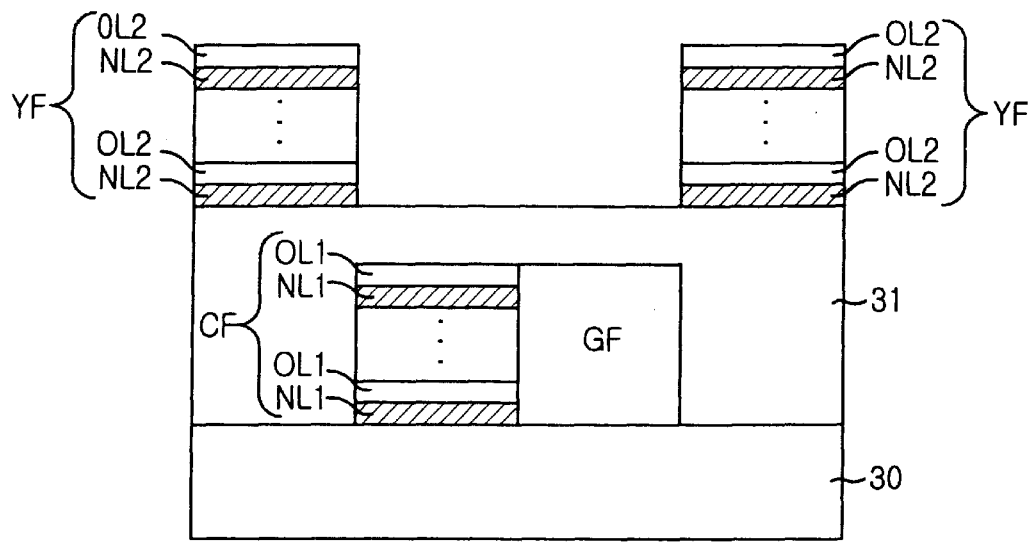

Referring to FIG. 4E, a second nitride layer NL2, whose reflective index is of 2.1, is formed on the first OCL 31 to a thickness ranging from about 508 Å to about 562 Å. Then, a second oxide layer OL2, whose reflective index is about 1.46, is formed on the second nitride layer NL2 to a thickness ranging from about 732 Å to about 809 Å. Thereafter, second stacked layers, each of which is composed of the second nitride layer NL2 and the second oxide layer OL2, are repeatedly formed.

Then, the second stacked layers are patterned to form a yellow color filter YF for transmitting only a yellow light. At this time, the yellow color filter YF is formed not to be overlapped with the cyan color filter CF and the green color filter GF.

Figure 4F:
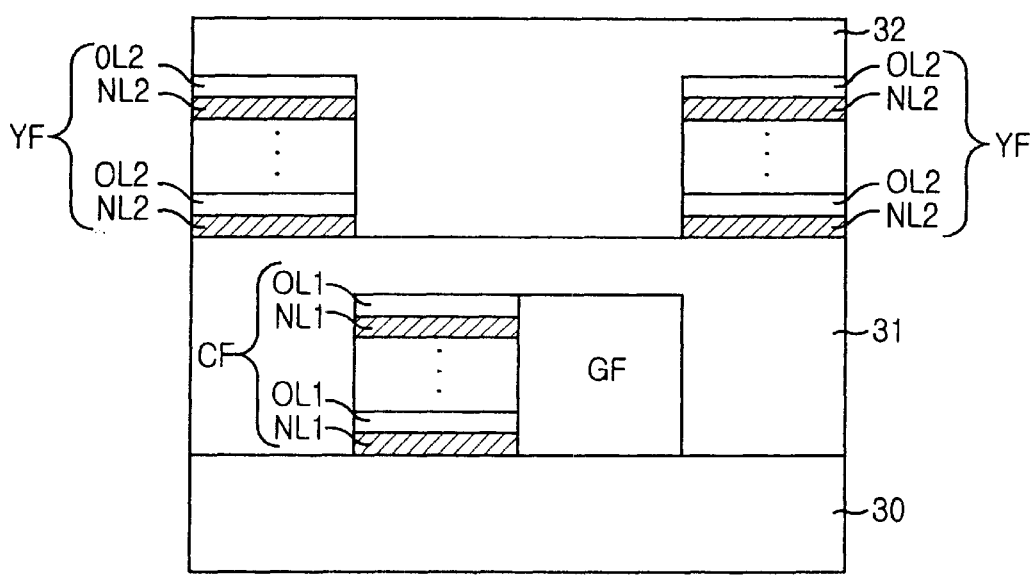

Referring to FIG. 4F, a photoresist is coated on a resulted structure to a thickness of about 1.6 m to form a second OCL 32. Then, a baking operation is carried out.

Compared with the prior art, the CMOS image sensor in accordance with the present invention prevents a formation of scum and overlaps of neighboring color filters, so that a characteristic of optical transmittance and a yield are remarkably improved.

Although the preferred embodiments have been disclosed for illustrative purposes, those skilled in the art will appreciate that various modifications, additions and substitutions are possible, without departing from the scope and spirit of the invention as disclosed in the accompanying claims.

What is claimed:

1. An image sensor comprising:
   a semiconductor structure;
   a first color filter formed on a first portion of the semiconductor structure, wherein the first color filter comprises a first stacked layer, the first stacked layer comprising a first nitride layer and a first oxide layer;
   a second color filter formed on a second portion of the semiconductor structure, the second color filter comprising a dyed photoresist, the second color filter engaging the first color filter; and
   a third color filter formed on a third portion of the semiconductor structure that is not overlapped with the first and the second color filter, wherein the third color filter comprises a second stacked layer, the second stacked layer comprising a second nitride layer and a second oxide layer.

2. A method for fabricating an image sensor, comprising:
   providing a semiconductor structure;
   forming a first color filter on the semiconductor structure, wherein the first color filter comprises a first stacked layer comprising a first nitride layer and a first oxide layer;
   forming a second color filter on the semiconductor structure in contact with the first color filter; and
   forming a third color filter on a portion of the semiconductor structure not overlapping with the first and the second color filter, wherein the third color filter comprises a second stacked layer comprises a second nitride layer and a second oxide layer.

3. An image sensor comprising:
   a semiconductor structure;
   a first color filter formed on a first portion of the semiconductor structure;
   a second color filter formed on a second portion of the semiconductor structure, and the second color filter comprising a dyed photoresist; and
   a third colored filter formed on a third portion of the semiconductor structure,
   wherein at least one of the first, second and third color filters comprise a stacked layer, the stacked layer comprising a nitride layer and an oxide layer.

4. The image sensor of claim 3, wherein at least one of the first, second and third color filters comprise more than two stacked layers.

5. The image sensor of claim 3, wherein the first color filter comprises a first stacked layer, the first stacked layer comprising a first nitride layer and a first oxide layer; and
   wherein the third color filter comprises a second stacked layer, the second stacked layer comprising a second nitride layer and a second oxide layer.

6. The image sensor of claim 3, further comprising a first coating layer formed on the first color filter and the second color filter.

7. The image sensor of claim 6, further comprising a second coating layer formed on the third color filter and the first coating layer.

8. The image sensor of claim 5, wherein the first and the second nitride layers each have a reflective index of about 2.1, and
   wherein the first and the second oxide layers each have a reflective index of about 1.46.

9. The image sensor of claim 8, wherein the first nitride layer has a thickness ranging from about 735 Å to about 813 Å, and
   wherein the first oxide layer has a thickness ranging from about 1046 Å to about 1166 Å.

10. The image sensor of claim 9, wherein the second nitride layer has a thickness ranging from about 508 Å to about 562 Å, and
   wherein the second nitride layer has a thickness ranging from about 732 Å to about 809 Å.

11. A method for fabricating an image sensor, comprising:

providing a semiconductor structure;

forming a first color filter on a first portion of the semiconductor structure;

forming a second color filter on a second portion of the semiconductor structure; and forming a third color filter on a third position of the semiconductor structure, wherein at least one of the first, second and third color filters comprise a stacked layer, the stacked layer comprising a nitride layer and an oxide layer.

12. The method of claim 11, wherein at least one of the first, second and third color filters comprise more than two stacked layers.

13. The method of claim 12, wherein the first color filter comprises a first stacked layer, the first stacked layer comprising a first nitride layer and a first oxide layer; and wherein the third color filter comprises a second stacked layer, the second stacked layer comprising a second nitride layer and a second oxide layer.

14. The method of claim 13, further comprising:

coating and patterning a photoresist on the first color filter and the second color filter to form a first coating layer; and performing a baking operation to the first coating layer.

15. The method of claim 14, further comprising:

coating and patterning a photoresist on the third color filter and the first coating layer to form a second coating layer; and performing a baking operation to the second coating layer.

16. The method of claim 13, wherein the first and the second nitride layers each have a reflective index of about 2.1, and wherein the first and the second oxide layers each have a reflective index of about 1.46.

17. The method of claim 16, wherein the first nitride layer has a thickness ranging from about 735 Å to about 813 Å, and wherein the first oxide layer has a thickness ranging from about 1046 Å to about 1166 Å.

18. The method of claim 17, wherein the second nitride layer has a thickness ranging from about 508 Å to about 562 Å, and wherein the second oxide layer has a thickness ranging from about 732 Å to about 809 Å.

19. The method of claim 13, wherein the first and the second nitride layers are formed by a plasma chemical vapor deposition.

* * * * *